US012568606B1

(12) United States Patent
Bonen et al.

(10) Patent No.: US 12,568,606 B1
(45) Date of Patent: Mar. 3, 2026

(54) COOLING OF PLUGGABLE DEVICES IN DEVICE PORTS USING THERMAL CONDUCTIVE PEDESTALS

(71) Applicant: Harmonic, Inc., San Jose, CA (US)

(72) Inventors: Adi Bonen, North York (CA); Eran Schwartz, Kiryat Bialik (IL)

(73) Assignee: Harmonic, Inc., San Jose, CA (US)

( * ) Notice: Subject to any disclaimer, the term of this patent is extended or adjusted under 35 U.S.C. 154(b) by 203 days.

(21) Appl. No.: 18/226,602

(22) Filed: Jul. 26, 2023

(51) Int. Cl.
H05K 7/20 (2006.01)

(52) U.S. Cl.
CPC ................................ H05K 7/20436 (2013.01)

(58) Field of Classification Search
CPC .................................................. H05K 7/20436
USPC ........................................................ 361/704
See application file for complete search history.

(56) References Cited

U.S. PATENT DOCUMENTS 8,358,504 B2    1/2013  McColloch et al.
9,370,123 B2    6/2016  Blumenthal 10,197,754 B2    2/2019   Moore et al.
10,749,288 B2    8/2020   Weltsch et al.
11,536,917 B2   12/2022   Zbinden et al.
2017/0075083 A1*  3/2017   Moore ..................... B32B 27/06
2019/0044299 A1*  2/2019   Kazav .................... H01R 27/00
2019/0387650 A1* 12/2019   Zhou ................... G02B 6/4261
2021/0072473 A1*  3/2021   Wall, Jr. ................. H01L 23/42
2021/0112683 A1*  4/2021   Mohajer ............. G02B 6/4261
2022/0019040 A1*  1/2022   Lu ....................... G02B 6/4246

* cited by examiner

*Primary Examiner* — Zhengfu J Feng
(74) *Attorney, Agent, or Firm* — Brokaw Patent Law, PC; Christopher J. Brokaw

(57) ABSTRACT

Improved cooling in one or more device ports of an article of manufacture. The device ports are affixed in position by a cage disposed within the article of manufacture. One or more single-piece thermal conductive pedestals have a portion in thermal contact with each device port. The one or more single-piece thermal conductive pedestals are formed from the same physical piece which serves as, at least a portion of, a physical exterior of the article of manufacture. Heat is transferred from the device ports to the exterior of the article of manufacture through the thermal conductive pedestals, thereby allowing device ports to the cooled without reliance upon airflow. The device ports may accommodate different types of pluggable devices, such as without limitations optical modules and transceivers.

40 Claims, 4 Drawing Sheets

COOLING OF PLUGGABLE DEVICES IN DEVICE PORTS USING THERMAL CONDUCTIVE PEDESTALS

RELATED APPLICATION DATA

The present application is similar to U.S. patent application Ser. No. 18/226,623, entitled 'Cooling of Pluggable Devices in Device Ports Using Oblique Angles,' invented by Adi Bonen and Eran Schwartz, filed the same day herewith, the entire contents of which are incorporated by reference for all purposes as if fully set forth herein.

FIELD OF THE INVENTION

Embodiments of the invention relate to the cooling of pluggable devices inserted into a device port of an article of manufacture.

BACKGROUND

Computer circuits generate heat upon continued use; unfortunately, excess heat may lead to performance degradation. For this reason, circuits which generate excess heat may be cooled during operation by diverting the generated heat elsewhere. A common way to do so in a computer is by using a fan to blow air over the heat generating circuits of concern during operation. The airflow created by the fan absorbs a certain amount of the heat generated by the computer circuits, which is then whisked away from the interior of the computer to the exterior of the computer by way of a vent.

Some devices cannot support adequate airflow to cool circuitry in this manner for a variety of reasons. For example, consider FIG. 1, which is an illustration of a device 100 typical in the prior art which cannot support adequate airflow to use a fan to cool circuitry within its interior. Device 100 represents a piece of computer network equipment, such as a switch of a size capable of being held in a person's hand. The casing of device 100 does not contain a vent and is too small to incorporate the use of a standard fan, and so no airflow is readily exchanged between its interior and exterior. The casing of device 100 need not be designed to be airtight for the lack of a vent to cause airflow to be insufficient to support cooling of heat generating components contained therein. Further, device 100 is also intended to be deployed inside a hermetically sealed enclosure that does not support internal air flow and/or venting. Such a hermetically sealed enclosure is used to protect the enclosed components from environmental conditions, such as water, moisture, and other contaminants, when deployed outside.

The pluggable devices, such as exemplary pluggable devices 104 and 106, which may be inserted into one of the device ports 110 of device 100 should not be permitted to overheat. A device port comprises a cavity and an electrical interface. A device port is designed to accommodate the manual insertion of a pluggable device into its cavity so that an electrical connection may be established between the host device (i.e., device 100 in this example) and the pluggable device. The pluggable device may, in turn, provide additional functionality to the host device, such as allowing the host device to communicate with other equipment in a network.

There are a wide variety of devices which may be manually plugged into a device port, one example being a small form-factor pluggable (SFP) transceiver. A SFP transceiver is a compact, hot-pluggable device that may be used to connect the host device to a network. SFP transceivers may be used to receive data as input from the host device and deliver the data to a recipient over networking fiber optic cables connected to the SFP transceiver. The form factor and the electrical interface of pluggable optical transceivers such as a SFP transceiver are typically specified by a multi-source agreement (MSA).

As a fan cannot be relied upon exclusively to cool circuitry during operation, devices in the prior art also rely upon thermal conduction to remove excess heat. To illustrate an example of how this process is performed in the prior art, consider FIG. 2, which is an illustration of a cross-section of a host device 100 shown in FIG. 1 in accordance with the prior art. The cross-section of device 100 shown in FIG. 2 is relative to plane 102, i.e., it is lengthwise cross section of device 100.

The device ports 110 shown in FIG. 2 are enclosed within a metal cage 120. Metal cage 120 is typically made out of a thin metal layer and functions to hold the device ports 110 in place within device 100. In addition to serving as an interface for connecting a pluggable device to a host device, a device port also functions the conduct heat away from any pluggable device inserted into the device port, which will be explained in greater detail below.

To operationally connect any pluggable device inserted into a device port 110, each device port 110 depicted in FIG. 2 is electronically connected to a first printed circuit board (PCB) 130. In the example of FIG. 2, device 100 comprises two printed circuit boards which are in electronic communication with one another, e.g., FIG. 2 depicts first printed circuit board (PCB) 130 and second printed circuit board layer 150, and electronic signals carried by electrical paths on one of these PCBs may be conveyed to electrical paths on the other. Device 100 may utilize two PCBs when deployed in a size constrained environment, such as a hermetically sealed enclosure. In the example of FIG. 2, first PCB 130, which resides in the upper portion 109 of device 100, is shorter in length than PCB 150, which resides in the lower portion 108 of device 100. The use of two separate and distinct printed circuit boards (PCB) of different sizes allows the device ports 110 to be electronically connected to the upper, smaller PCB while, at the same time, having a position that permits technicians to access the device ports 110 with their fingers, which is necessary as technicians manually insert pluggable devices into device ports 110 during service. Having the device ports 110 reside in the upper portion 109 of device 100 allows for some space underneath and in front of the device ports 110, which provides sufficient finger access to device ports 110 to technicians.

A metal layer 140 is disposed between first PCB 130 and second PCB 150. Metal layer 140 provides mechanical support to first PCB 130, electrical magnetic interference (EMI) shielding between first PCB 130 and second PCB 150, and assist with heat conductance. Underneath the second PCB layer 150 is outer base layer 160, which may also be composed of metal. While not shown in FIG. 2, device 100 may be deployed in a hermetically sealed environment, and thus, may itself be enclosed by another device, such as a cable network node.

Electrical components in device 100 are difficult to cool during operation, particularly those mounted on PCB 130, such as the pluggable devices inserted into device ports 110. To illustrate why, FIG. 3 is a cross-sectional illustration depicting how heat travels by conduction through device 300 in accordance with the prior art. As shown in FIG. 3, device 300 comprises two printed circuit boards, namely an upper printed circuit board 330 and a lower printed circuit board 360. A portion of the heat generated by components inside the pluggable devices held in device ports 310 is transferred to metal cage 320 by thermal conduction. As the metal cage 320 warms, a portion of the heat transferred from the metal cage 320 to metal layer 340 within device 300. As shown in FIG. 3, the heat conduction from metal layer 340 to heat conveyance layer 370 is typically implemented through a long and narrow path which reduces the efficiency of heat transfer and results in a significant rise in temperature in the devices held in device ports 310, which diminishes how much heat can be transferred from these devices through heat conveyance layer 370 and the outer base layer 360.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for improved cooling in one or more device ports of an article of manufacture are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention may be used to cool circuitry during operation using innovations involving heat or thermal conduction. Advantageously, embodiments may be used in operational environments that do not possess or support sufficient airflow to facilitate cooling, such as for example the interior of devices lacking adequate venting, circuitry executing in a hermetically sealed environment, devices deployed in high altitude, and devices deployed in a vacuum or orbital environment.

Embodiments of the invention have particular utility in providing improved cooling to one or more device ports used in a wide range of devices. For simplicity, to represent the wide range of devices which may employ an embodiment of the invention, a device that employs the invention shall be referred to herein as an article of manufacture. Specific examples of the types of devices which may be represented by the term articles of manufacture include but are not limited to the following: a wireless communication device, an Ethernet switch, an Optical Line Terminal (OLT), a Remote PHY device (RPD), and a Remote MACPHY device (RMD).

An article of manufacture of an embodiment comprises one or more device ports. A device port comprises a cavity and an electrical interface. The cavity portion of a device port accommodates the insertion of a pluggable device. The electrical interface portion of a device portion accommodates the establishment of an electrical connection between the pluggable device and the article of manufacture having the device port. For example, a device port may have a cavity that is sized and shaped to accommodate the insertion of, and subsequently coupled to, an optical module, a small form-factor pluggable device (SFP), an XFP optical transceiver, an SFP+ optical transceiver, a Quad Small Form-factor pluggable plus (QSFP+) device, and a CF2 device.

Figure 1:
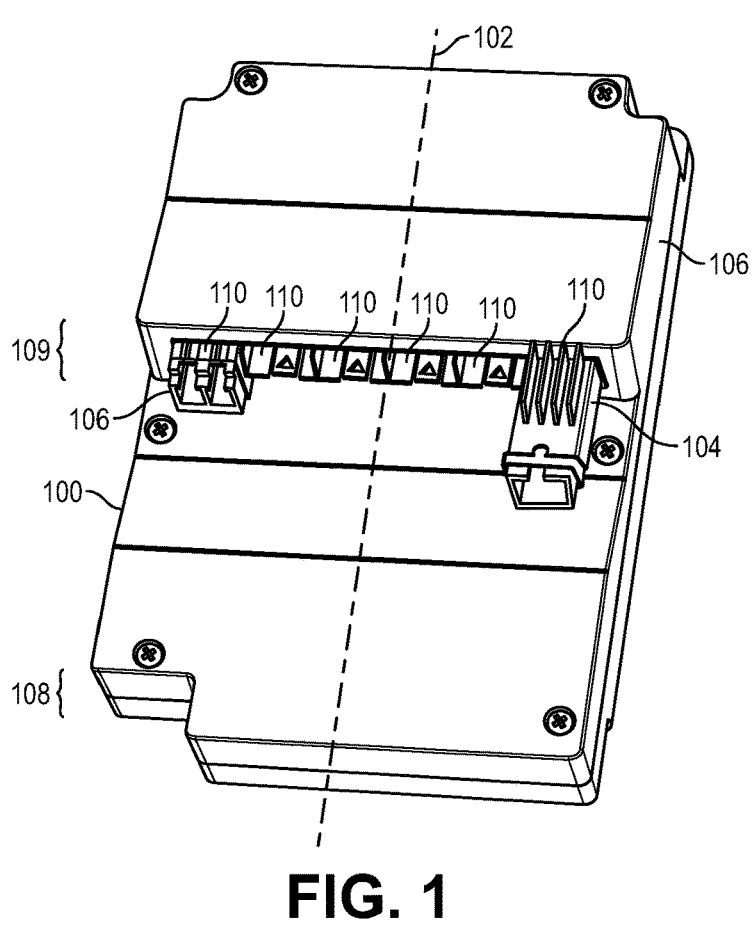
FIG. 1 is an illustration of an exemplary device typical of the prior art.
Figure 2:
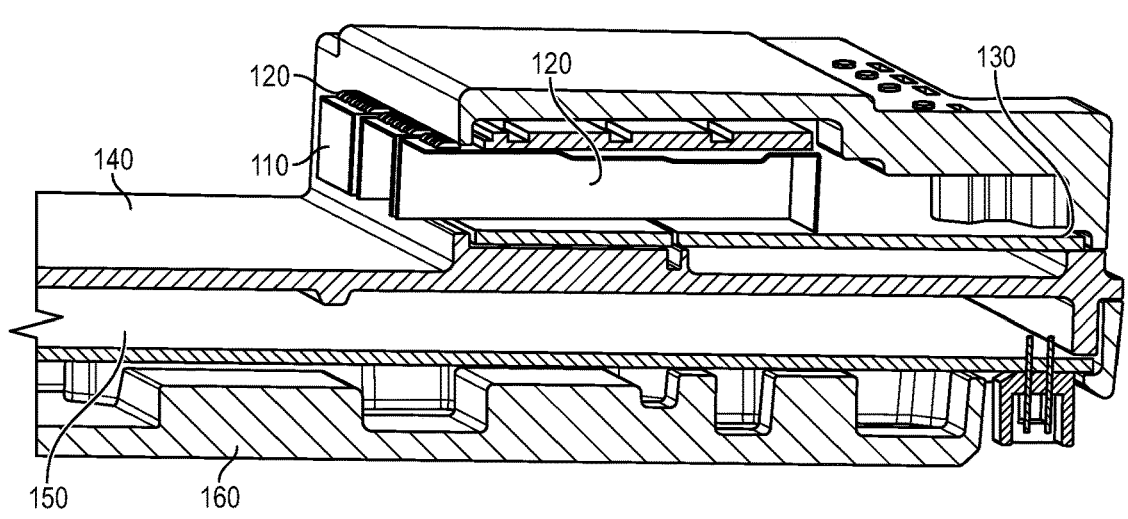
FIG. 2 is a cross-sectional illustration of an exemplary host device that includes a device port in accordance with the prior art.
Figure 3:
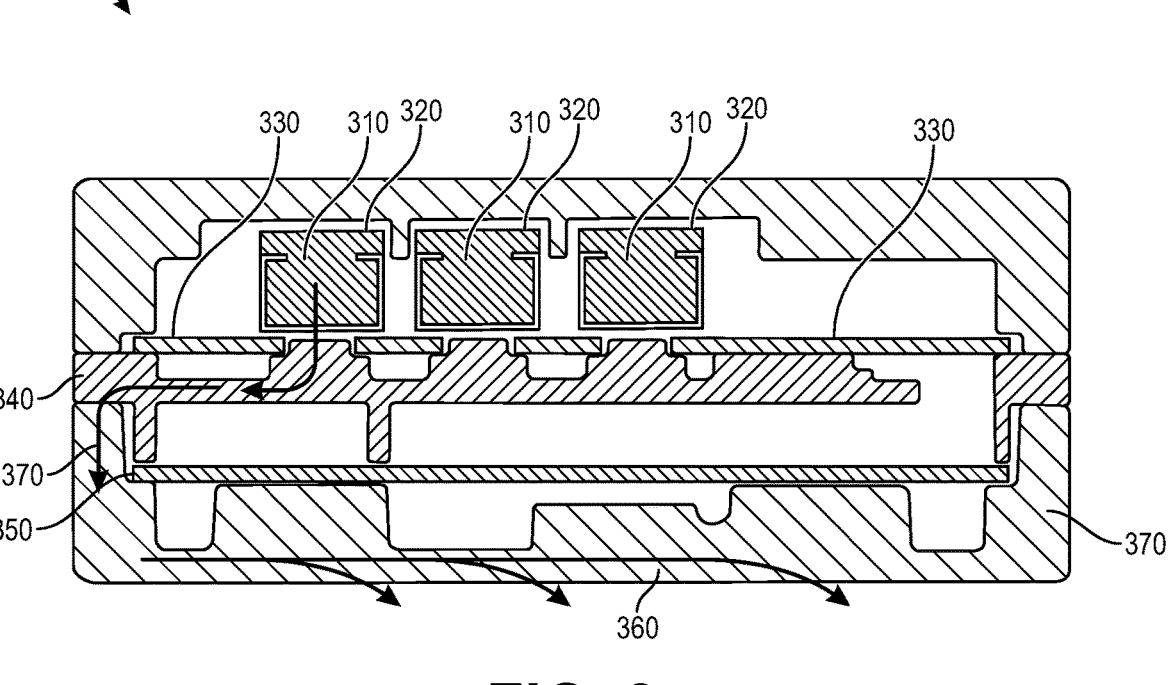
FIG. 3 is a cross-sectional illustration depicting how heat travels by conduction through an exemplary host device in accordance with the prior art.
Figure 4:
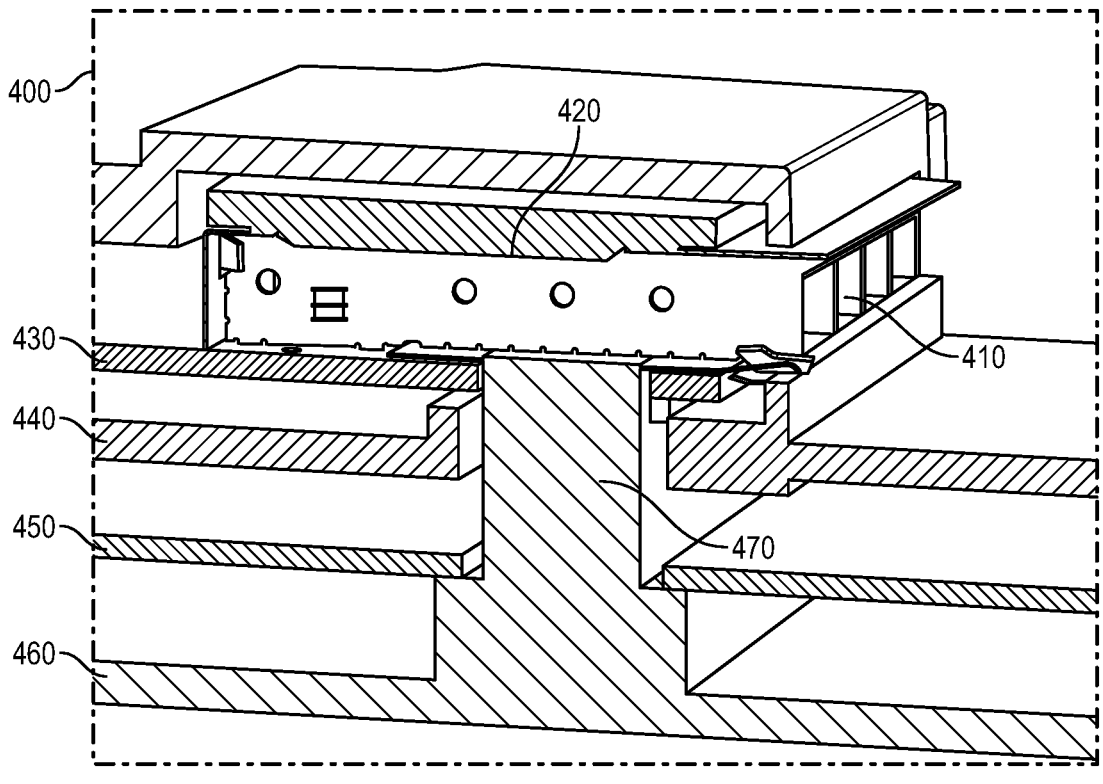
FIG. 4 is a cross-sectional illustration of an article of manufacture having improved cooling in one or more device ports using thermal conductive pedestals in accordance with one embodiment of the invention.

FIG. 4 is a cross-sectional illustration of device 400, an article of manufacture having improved cooling in one or more device ports using thermal conductive pedestals in accordance with one embodiment of the invention. Device 400 comprises outer base layer 460 and comprises a plurality of device ports 410 that are formed using a metal cage 420. Metal cage 420 is mounted on printed circuit board 430. Printed circuit board 430 may be operationally connected to printed circuit board 450. Metal layer 440 may be disposed between printed circuit board 430 and printed circuit board 450.

Notably, embodiments of the invention employ one or more single-piece thermal conductive pedestals 470. The upper portion of each of the one or more single-piece thermal conductive pedestals 470 is in thermal contact with the metal cage 420 portion forming each of the device ports 410. Each of the one or more single-piece thermal conductive pedestals 470 is formed from the same physical piece which serves as, at least a portion of, a physical exterior and base of the article of manufacture, forming a short and wide heat path from the pluggable optical transceivers held in device ports 410 and the enclosure on which device 400 is mounted. For example, the one or more single-piece thermal conductive pedestals 470 are formed out of the same physical piece as outer base layer 460. Thermal conductive pedestals 470 and outer base layer 460 may be made from metal, such as but not limited to aluminum.

The one or more thermal conductive pedestals 470 are in thermal contact with each of the device ports 410; that is to say, each of the device ports 410 may easily transfer heat using thermal conduction to the one or more thermal conductive pedestals 470. In one embodiment, metal cage 420 directly abuts against both the pluggable devices held in the plurality of device ports 410 and one or more single-piece thermal conductive pedestals 470. In such an embodiment, heat may be easily transferred from the pluggable devices held in device ports 410 to the metal cage 420, and thereafter from the metal cage 420 to the one or more single-piece thermal conductive pedestals 470. In another embodiment, the one or more single-piece thermal conductive pedestals 470 are in direct physical contact with the plurality of pluggable devices held in device ports 410 without the presence of the metal cage 420 being therebetween. In either embodiment, heat generated by the pluggable devices held in device ports 410 may be transferred either directly to the one or more single-piece thermal conductive pedestals 470 or indirectly by way of the metal cage 420.

In an embodiment, a malleable thermal conductive material is disposed on the portion of one or more single-piece thermal conductive pedestals 470 making physical contact with either metal cage 420 or the device ports 410. Doing so allows for a solid, uninterrupted physical connection between the two surfaces, thus providing an optimal boundary for heat to be transferred between two surfaces using thermal conduction.

The one or more single-piece thermal conductive pedestals 470 may protrude from outer base layer 460 and extend through a variety of structures or layers in the article of manufacture. For example, in an embodiment, the one or more single-piece thermal conductive pedestals 470 extend through one or more printed circuit boards (PCBs). In another embodiment, the one or more single-piece thermal conductive pedestals 470 extend through a structural layer which is not a printed circuit board (PCB). These embodiments are not mutually exclusive, as one or more single-piece thermal conductive pedestals 470 might extend through one or more printed circuit boards (PCBs) and also through one or more other layers which are not a PCB.

Advantageously, embodiments of the invention allow for the heat generated by certain circuitry and components, such as but not limited to pluggable devices held in device ports 410, to be transferred by thermal conduction to one or more thermal conductive pedestals 470. After the heat is transferred to one or more thermal conductive pedestals 470, the heat will cause outer base layer 460 to increase in temperature, as one or more thermal conductive pedestals 470 and outer base layer 460 are a single piece. Thereafter, the heated outer base layer 460 will radiate or conduct heat to the exterior of the article of manufacture; thus, heat may be continuously transferred away from device ports 410 to the exterior of the article of manufacture without practical limit.

Certain embodiments may be designed to provide increased finger access to device ports, which is helpful when a technician manually inserts a pluggable device into a device port. Embodiments may do so using certain structure having oblique angles, and in doing so, allow sufficient finger access to device ports using a single printed circuit board (PCB) rather than employing an upper and lower PCB, which is a substantial savings in cost of materials, eliminates the complexity of conveying electrical signal between PCBs, and reduces the complexity in cooling circuitry, e.g., all components are easier to cool directly into the base of the device. To illustrate such an embodiment, consider FIG. 5, which is a cross-sectional illustration of device 500, an article of manufacture having improved cooling in one or more device ports using oblique angles in accordance with another embodiment of the invention.

Figure 5:
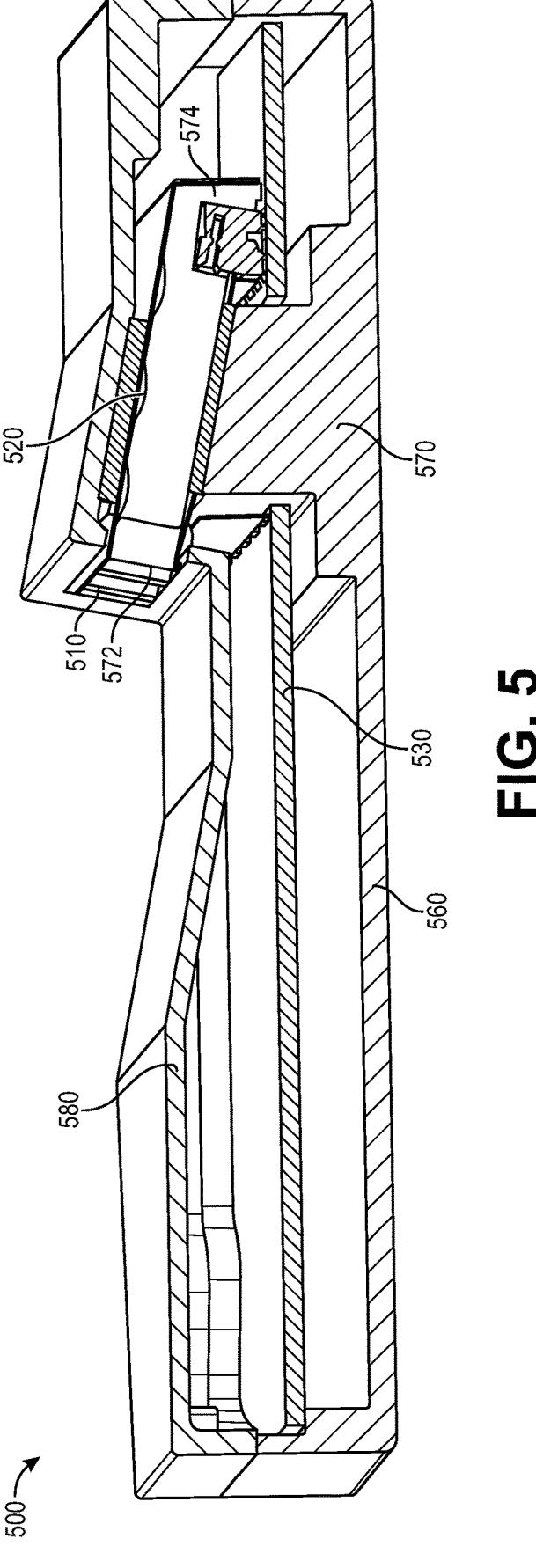
FIG. 5 is a cross-sectional illustration of an article of manufacture having improved cooling in one or more device ports using oblique angles in accordance with another embodiment of the invention.

Device 500, shown in FIG. 5, possesses a mechanical enclosure having a top portion 580 and an outer base layer 560 serving as a bottom portion. Device 500 possess device ports 510 that are formed by metal cage 520. Notice that metal cage 520 is at an oblique angle relative to printed circuit board 530; that it is say, that metal cage 520 runs neither parallel nor perpendicular to printed circuit board 530. As a result, the openings 572 of device ports 510 into which pluggable devices are inserted are further away from the surface of printed circuit board 530 than the opposing ends 574 of the device ports 510 where the pluggable devices are electrically connected to printed circuit board 530. This oblique angle of metal cage 520 provides finger access to the opening of device ports 510. As a result, device ports 510 may be electronically connected to a single printed circuit board 530 while still providing finger access to the device ports 510 to technicians; consequently, the embodiment shown in FIG. 5 need not include two or more printed circuit boards to support use of device ports 510 having finger access and without requiring enlargement of the area occupied by device 500.

One or more thermal conductive pedestals 570 are in thermal contact with each of the device ports 510; that is to say, each of the pluggable devices held in device ports 510 may easily transfer heat using thermal conduction to the one or more thermal conductive pedestals 570. In one embodiment, metal cage 520 directly abuts against both the plurality of the pluggable devices held in device ports 510 and one or more single-piece thermal conductive pedestals 570. In such an embodiment, heat may be easily transferred from the pluggable devices held in device ports 510 to the metal cage 520, and thereafter from the metal cage 520 to the one or more single-piece thermal conductive pedestals 570. In another embodiment, the one or more single-piece thermal conductive pedestals 570 are in direct physical contact with the plurality of the pluggable devices held in device ports 510 without the presence of the metal cage 520 being therebetween. In either embodiment, the surface of the one or more single-piece thermal conductive pedestals 570 closest to the device ports 510 is angled the same relative to the device ports 510. This way, the surface in the one or more single-piece thermal conductive pedestals 570 is as close as possible to the surface of the device ports 510, and the heat generated by the pluggable devices held in device ports 510 may be transferred either directly to the one or more single-piece thermal conductive pedestals 570 or indirectly by way of the metal cage 520.

In an embodiment, a malleable thermal conductive material is disposed on the portion of the one or more single-piece thermal conductive pedestals 570 making physical contact with metal cage 520 forming device ports 510. Doing so allows for a solid, uninterrupted physical connection between the two surfaces, thus providing an optimal boundary for heat to be transferred between two surfaces using thermal conduction.

As shown in FIG. 5, those in the art shall appreciate that the one or more single-piece thermal conductive pedestals 570 may extend through PCB 530. While not shown FIG. 5, those in the art shall appreciate that the one or more single-piece thermal conductive pedestals 570 may extend through a structural layer other than PCB 530.

Advantageously, the approach shown in FIG. 5 permits increased finger access to device ports using a single printed circuit board (PCB) rather than employing an upper and lower PCB, which is a substantial savings in cost of materials, eliminates the complexity of conveying electrical signal between PCBs, and reduces the complexity in cooling circuitry, e.g., all components are easier to cool directly into outer base layer 560. Further, having the surface of the one or more single-piece thermal conductive pedestals 470 at an oblique angle relative to the surface of PCB 430 allows the heat absorbing contact of the one or more single-piece thermal conductive pedestals 470 to be greater in length than if the same surface ran parallel to PCB 430. The increased length in contact surface of the one or more single-piece thermal conductive pedestals 470 permits the pedestals to absorb an increased amount of heat, which can be discharged to the external environment via outer base layer 560 of the article of manufacture.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An article of manufacture having a plurality of device ports, comprising:
the plurality of device ports affixed in position by a cage disposed within said article of manufacture, wherein said article of manufacture is disposed in a hermetically sealed environment; and
one or more single-piece thermal conductive pedestals having a portion in thermal contact with each of said plurality of device ports, wherein said one or more single-piece thermal conductive pedestals are formed from the same physical piece which serves as, at least a portion of, a physical exterior of said article of manufacture.

2. The article of manufacture of claim 1, wherein each of said plurality of device ports is sized and shaped to accommodate an optical module.

3. The article of manufacture of claim 1, wherein each of said plurality of device ports is sized and shaped to accommodate one or more of a small form-factor pluggable device (SFP), an XFP optical transceiver, an SFP+ optical transceiver, a Quad Small Form-factor pluggable plus (QSFP+) device, and a CF2 device.

4. The article of manufacture of claim 1, wherein said cage directly abuts against both a plurality of devices plugged into the plurality of device ports and the one or more single-piece thermal conductive pedestals.

5. The article of manufacture of claim 1, wherein said portion of the one or more single-piece thermal conductive pedestals is in direct physical contact with at least one device plugged into at least one of said plurality of device ports.

6. The article of manufacture of claim 1, wherein a malleable thermal conductive material is disposed on said portion of the one or more single-piece thermal conductive pedestals.

7. The article of manufacture of claim 1, wherein said article of manufacture is a wireless communication device, an Ethernet switch, an Optical Line Terminal (OLT), a Remote PHY device (RPD), or a Remote MACPHY device (RMD).

8. The article of manufacture of claim 1, wherein said article of manufacture is disposed in a vacuum or orbital environment.

9. The article of manufacture of claim 1, wherein said cage and said one or more single-piece thermal conductive pedestals are comprised of metal.

10. The article of manufacture of claim 1, wherein said one or more single-piece thermal conductive pedestals extend through one or more printed circuit boards (PCBs).

11. The article of manufacture of claim 1, wherein said one or more single-piece thermal conductive pedestals extend through a structural layer which is not a printed circuit board (PCB).

12. The article of manufacture of claim 1, wherein said cage shares a boundary with the plurality of device ports and the one or more single-piece thermal conductive pedestals, wherein each of the plurality of device ports comprises a cavity and an electrical interface.

13. The article of manufacturer of claim 1, wherein said portion of the one or more single piece thermal conductor pedestals shares a boundary with said plurality of device ports, wherein each of said plurality of device ports comprises a cavity and an electrical interface.

14. A method for cooling a pluggable device inserted into at least one device port of an article of manufacture having a plurality of device ports, comprising:
affixing the plurality of device ports in position by a cage disposed within said article of manufacture, wherein said article of manufacture is disposed in a hermetically sealed environment; and
disposing in position one or more single-piece thermal conductive pedestals to have a portion in thermal contact with each of said plurality of device ports, wherein said one or more single-piece thermal conductive pedestals are formed from the same physical piece which serves as, at least a portion of, a physical exterior of said article of manufacture.

15. The method of claim 14, wherein each of said plurality of device ports is sized and shaped to accommodate an optical module.

16. The method of claim 14, wherein each of said plurality of device ports is sized and shaped to accommodate one or more of a small form-factor pluggable device (SFP), an XFP optical transceiver, an SFP+ optical transceiver, a Quad Small Form-factor pluggable plus (QSFP+) device, and a CF2 device.

17. The method of claim 14, wherein said cage directly abuts against the pluggable device and the one or more single-piece thermal conductive pedestals.

18. The method of claim 14, wherein said portion of the one or more single-piece thermal conductive pedestals is in direct physical contact with the pluggable device.

19. The method of claim 14, wherein a malleable thermal conductive material is disposed on said portion of the one or more single-piece thermal conductive pedestals.

20. The method of claim 14, wherein said one or more single-piece thermal conductive pedestals extend through one or more printed circuit boards (PCBs).

21. An article of manufacture having a plurality of device ports, comprising:
the plurality of device ports affixed in position by a cage disposed within said article of manufacture, wherein said article of manufacture is disposed in a vacuum or orbital environment; and
one or more single-piece thermal conductive pedestals having a portion in thermal contact with each of said plurality of device ports, wherein said one or more single-piece thermal conductive pedestals are formed from the same physical piece which serves as, at least a portion of, a physical exterior of said article of manufacture.

22. The article of manufacture of claim 21, wherein each of said plurality of device ports is sized and shaped to accommodate an optical module.

23. The article of manufacture of claim 21, wherein each of said plurality of device ports is sized and shaped to accommodate one or more of a small form-factor pluggable device (SFP), an XFP optical transceiver, an SFP+ optical transceiver, a Quad Small Form-factor pluggable plus (QSFP+) device, and a CF2 device.

24. The article of manufacture of claim 21, wherein said cage directly abuts against both a plurality of devices plugged into the plurality of device ports and the one or more single-piece thermal conductive pedestals.

25. The article of manufacture of claim 21, wherein said portion of the one or more single-piece thermal conductive pedestals is in direct physical contact with at least one device plugged into at least one of said plurality of device ports.

26. The article of manufacture of claim 21, wherein a malleable thermal conductive material is disposed on said portion of the one or more single-piece thermal conductive pedestals.

27. The article of manufacture of claim 21, wherein said article of manufacture is a wireless communication device, an Ethernet switch, an Optical Line Terminal (OLT), a Remote PHY device (RPD), or a Remote MACPHY device (RIMD).

28. The article of manufacture of claim 21, wherein said cage and said one or more single-piece thermal conductive pedestals are comprised of metal.

29. The article of manufacture of claim 21, wherein said cage shares a boundary with the plurality of device ports and the one or more single-piece thermal conductive pedestals, wherein each of the plurality of device ports comprises a cavity and an electrical interface.

30. The article of manufacturer of claim 21, wherein said portion of the one or more single piece thermal conductor pedestals shares a boundary with said plurality of device ports, wherein each of said plurality of device ports comprises a cavity and an electrical interface.

31. An article of manufacture having a plurality of device ports, comprising:

the plurality of device ports affixed in position by a cage disposed within said article of manufacture; and one or more single-piece thermal conductive pedestals having a portion in thermal contact with each of said plurality of device ports, wherein said one or more single-piece thermal conductive pedestals are formed from the same physical piece which serves as, at least a portion of, a physical exterior of said article of manufacture, and wherein said one or more single-piece thermal conductive pedestals extend through one or more printed circuit boards (PCBs).

32. The article of manufacture of claim 31, wherein each of said plurality of device ports is sized and shaped to accommodate an optical module.

33. The article of manufacture of claim 31, wherein each of said plurality of device ports is sized and shaped to accommodate one or more of a small form-factor pluggable device (SFP), an XFP optical transceiver, an SFP+ optical transceiver, a Quad Small Form-factor pluggable plus (QSFP+) device, and a CF2 device.

34. The article of manufacture of claim 31, wherein said cage directly abuts against both a plurality of devices plugged into the plurality of device ports and the one or more single-piece thermal conductive pedestals.

35. The article of manufacture of claim 31, wherein said portion of the one or more single-piece thermal conductive pedestals is in direct physical contact with at least one device plugged into at least one of said plurality of device ports.

36. The article of manufacture of claim 31, wherein a malleable thermal conductive material is disposed on said portion of the one or more single-piece thermal conductive pedestals.

37. The article of manufacture of claim 31, wherein said article of manufacture is a wireless communication device, an Ethernet switch, an Optical Line Terminal (OLT), a Remote PHY device (RPD), or a Remote MACPHY device (RMD).

38. The article of manufacture of claim 31, wherein said cage and said one or more single-piece thermal conductive pedestals are comprised of metal.

39. The article of manufacture of claim 31, wherein said cage shares a boundary with the plurality of device ports and the one or more single-piece thermal conductive pedestals, wherein each of the plurality of device ports comprises a cavity and an electrical interface.

40. The article of manufacturer of claim 31, wherein said portion of the one or more single piece thermal conductor pedestals shares a boundary with said plurality of device ports, wherein each of said plurality of device ports comprises a cavity and an electrical interface.

* * * * *